United States Patent [19]

Kuwata

[11] Patent Number: 5,488,237

[45] Date of Patent: Jan. 30, 1996

[54] SEMICONDUCTOR DEVICE WITH DELTA-DOPED LAYER IN CHANNEL REGION

[75] Inventor: Nobuhiro Kuwata, Yokohama, Japan

[73] Assignee: Sumitomo Electric Industries, Ltd., Japan

[21] Appl. No.: 16,263

[22] Filed: Feb. 11, 1993

[30] Foreign Application Priority Data

Feb. 14, 1992 [JP] Japan .................................... 4-028301
Feb. 24, 1992 [JP] Japan .................................... 4-036411

[51] Int. Cl.⁶ ........................ H01L 27/12; H01L 29/267; H01L 29/80
[52] U.S. Cl. ................ 257/194; 257/24; 257/27; 257/192
[58] Field of Search ............... 257/24, 27, 190, 257/192, 194, 187

[56] References Cited

U.S. PATENT DOCUMENTS

| | | | |
|---|---|---|---|
| 4,833,508 | 5/1989 | Ishikawa et al. | 257/194 |
| 4,862,228 | 8/1989 | Ralph | 257/24 |
| 5,023,674 | 6/1991 | Hikosaka et al. | 257/24 |

FOREIGN PATENT DOCUMENTS

| | | | |
|---|---|---|---|
| 61-96769 | 5/1986 | Japan | 257/194 |
| 63-161678 | 7/1988 | Japan | 257/24 |
| 1074765 | 3/1989 | Japan | 257/194 |
| 02192739 | 1/1990 | Japan | 257/194 |

OTHER PUBLICATIONS

Schubert et al., "Selectively S–Doped Al Ca As/ As Ga$_2$ Heterostructures with high 2 Deg>, $1.5 \times 10^{12} cm^{-2}$ For Field Effect Transistors," App. Phys. Lett., vol. 51, No. 15, 12 Oct. 1987, pp. 1170–1172.

Primary Examiner—Mahshid D. Saadat
Attorney, Agent, or Firm—Beveridge, DeGrandi, Weilacher & Young

[57] ABSTRACT

A high speed transistor featured by a wide operation range and a high gain has a channel layer of a three-layer structure wherein undoped GaInAs layers are arranged above and beneath a GaAs layer. The GaAs layer includes at least one n-type delta doped layer. A cap layer, which is an undoped GaAs layer, and a buffer layer are formed above and beneath the channel layer on the substrate. A gate electrode and a source region, a drain region, a source electrode and a drain electrode which are self-aligned with respect to the gate electrode, also are formed.

20 Claims, 10 Drawing Sheets

SEMICONDUCTOR DEVICE WITH DELTA-DOPED LAYER IN CHANNEL REGION

BACKGROUND OF THE INVENTION

1. Field of the Invention

The present invention relates to a semiconductor device, and more particularly to a hetero-junction field effect transistor which operates at a high speed with a low noise and a microwave monolithic integrated circuit (MMIC) which uses the FET.

2. Related Background Art

Figure 1:
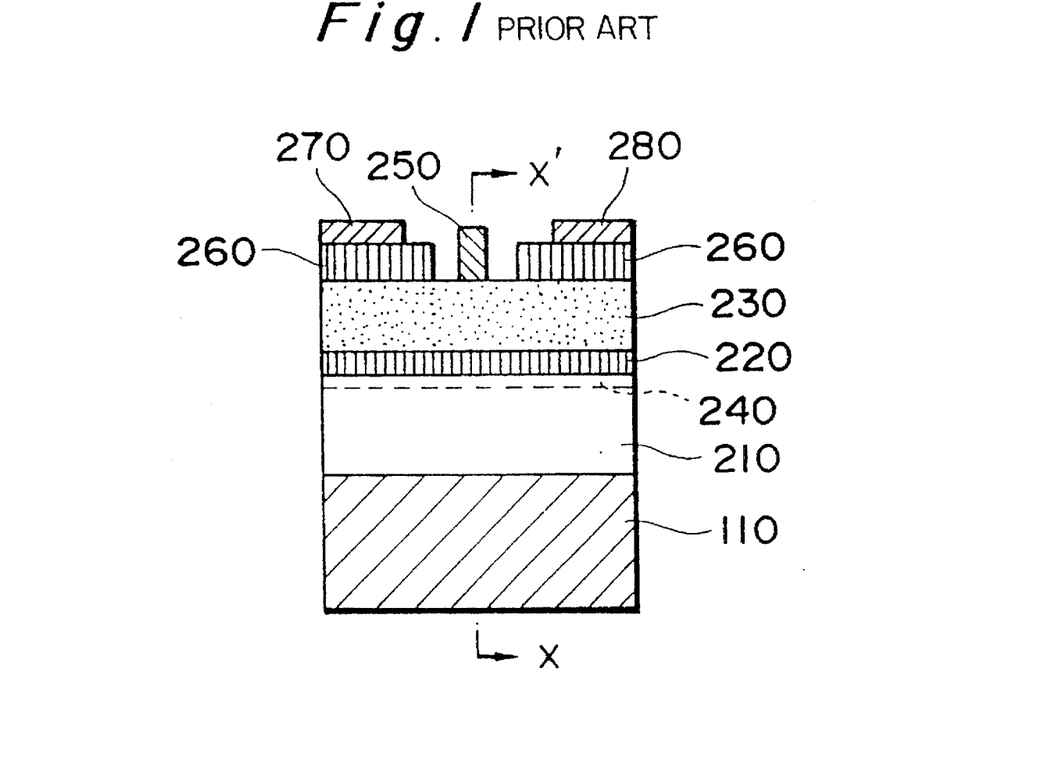
FIG. 1 shows a structure of conventional HEMT.

A hetero-junction field effect transistor (or high electron mobility transistor (HEMT)) which uses a selectively doped hetero-junction has been proposed as a high operating speed transistor. FIG. 1 shows a structure of a typical AlGaAs/GaAs high electron mobility transistor. The structure is described below.

An undoped GaAs layer 210 is formed on a semi-insulating GaAs substrate 110, and an ALGaAs layer (undoped AlGaAs spacer layer) 220 having a smaller affinity than that of GaAs is formed on the GaAs layer 210. The AlGaAs layer consists of the undoped AlGaAs spacer layer 220 and an AlGaAs layer 230 doped with n-type dopant (an element such as Si or Se), which are formed on the GaAs 210. A gate electrode 250 is formed on the AlGaAs layer, and a source electrode 270 and a drain electrode 280 are formed on a Si-GaAs contact layer 260 to sandwich the gate electrode 250. This electrode structure is called a recessed structure because the gate electrode is provided at the bottom of the grove (recess), and it is a common gate electrode structure in the HEMT. By this structure, two-dimensional electron gas 240 is formed on the side of GaAs on the interface of AlGaAs/GaAs, and it serves as a drain-source channel (current path). A density of the two-dimensional electron gas 240 is controlled by the gate electrode 250 and a current between the source electrode 270 and the drain electrode 280 is modulated.

Figure 2:
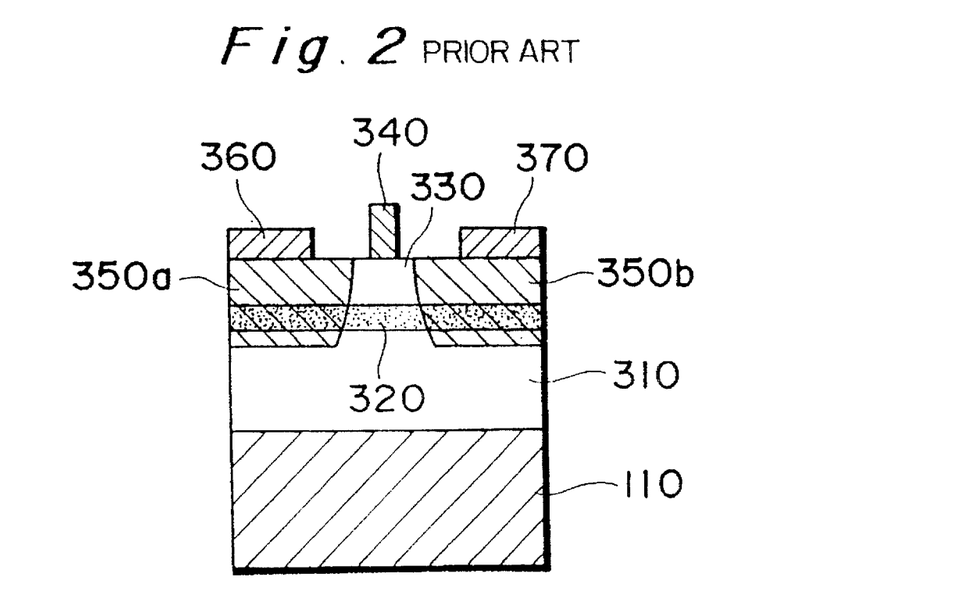
FIG. 2 shows a structure of a conventional pulse doped MESFET.

On the other hand, a pulse doped MESFET has been reported in the paper ED89-152 of the Study Group of the Electronic and Information as a transistor other than the HEMT, which operates at a high speed with a low noise. The pulse doped MESFET uses a GaAs layer having Si pulsively doped as a channel and has a structure as shown in FIG. 2. The structure is described below.

An undoped GaAs buffer layer 310 having a p carrier conductivity type (carrier density $\sim 5 \times 10^{15}$ cm$^{-3}$) is formed on a semi-insulating GaAs substrate 110, and Si-doped GaAs ($\sim 14 \times 10^{18}$ cm$^{-3}$) 320 is formed with a thickness of 100 angstrom. An undoped GaAs cap layer 330 having an n carrier conductivity type ($\sim 1 \times 10^{15}$ cm$^{-3}$) is formed on the Si-doped GaAs channel layer 320. A profile of inpurity distribution is low in the GaAs buffer layer 310 and the GaAs cap layer 330, and pulsively high in the Si-doped GaAs layer 320. Therefore, this structure is called a pulse doped structure. A gate electrode 340, and n$^+$ ion implantation layer 350a and 350b, a source electrode 360 and a drain electrode 370 which are self-aligned to the gate electrode 340 are formed on the pulse doped structure. This electrode structure is called a planar structure because the gate electrode is planar.

Figure 3:
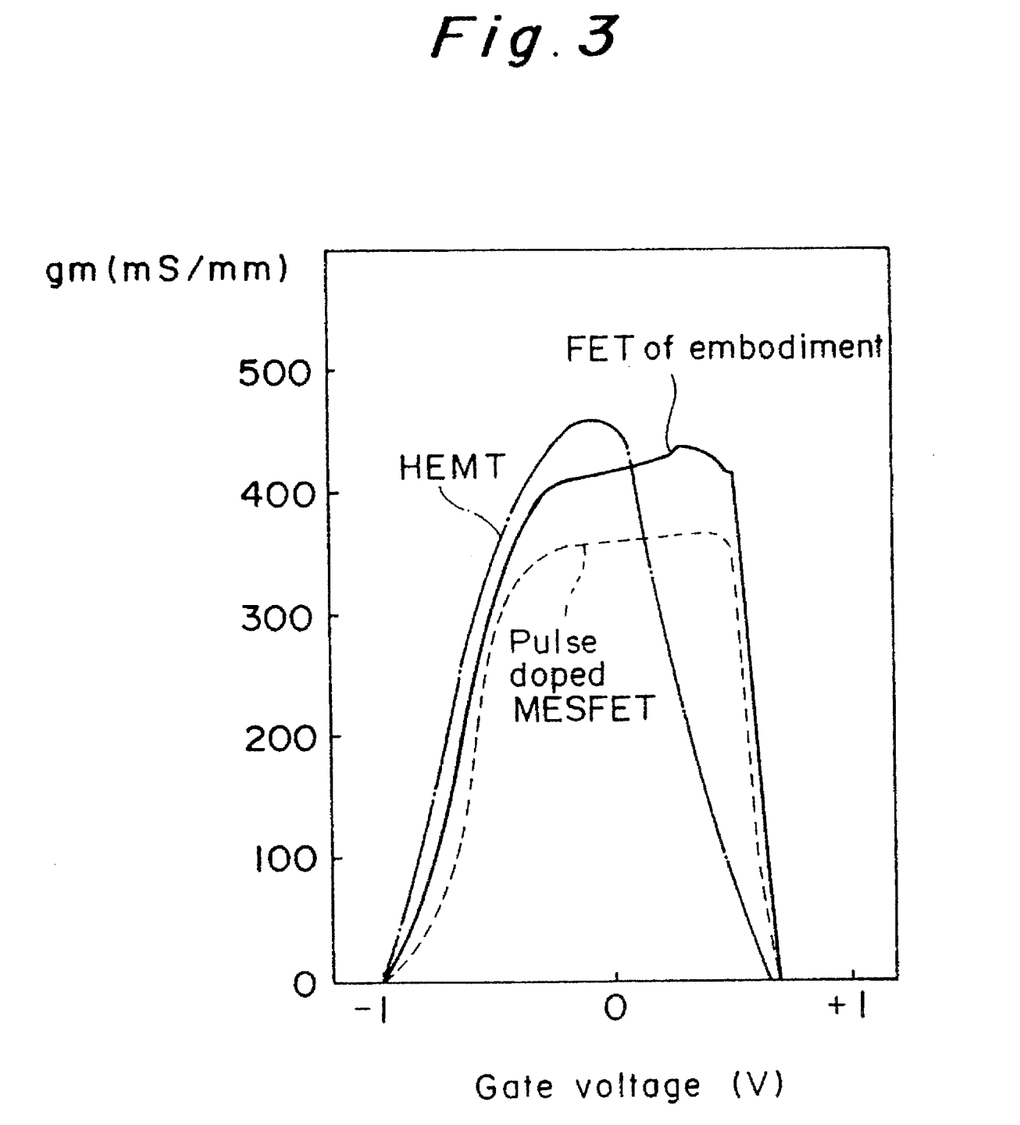
FIG. 3 shows characteristic of an embodiment and prior art.

FIG. 3 shows examples of characteristics of the AlGaAs/GaAs HEMT and the pulse doped MESFET. It shows a gate bias dependency of a transfer conductance (gm) when a device having a gate length of 0.3 μm is used. The pulse doped MESFET has a mesa profile (broken line) of the transfer conductance gm to the gate bias, and a change in the transfer conductance gm when a biasing point is slightly shifted is small, but the value of the transfer conductance gm is smaller than that of the HEMT. The abruptness of the rise of the transfer conductance gm at the gate bias near a threshold (Vth), which is important as a low noise device, is inferior to the HEMT.

On the other hand, the HEMT exhibits an abrupt rise of the transfer conductance gm and a peak thereof is high, but since it has a peak profile (chain line) to the gate bias, the transfer conductance gm is significantly reduced if the bias point is slightly shifted. The reduction of the transfer conductance gm of the HEMT in a shallow gate bias side is due to a phenomenon called a real space transition in which a portion of the two-dimensional electrons transists to the AlGaAs layer which has a low electron velocity.

Figure 4A:
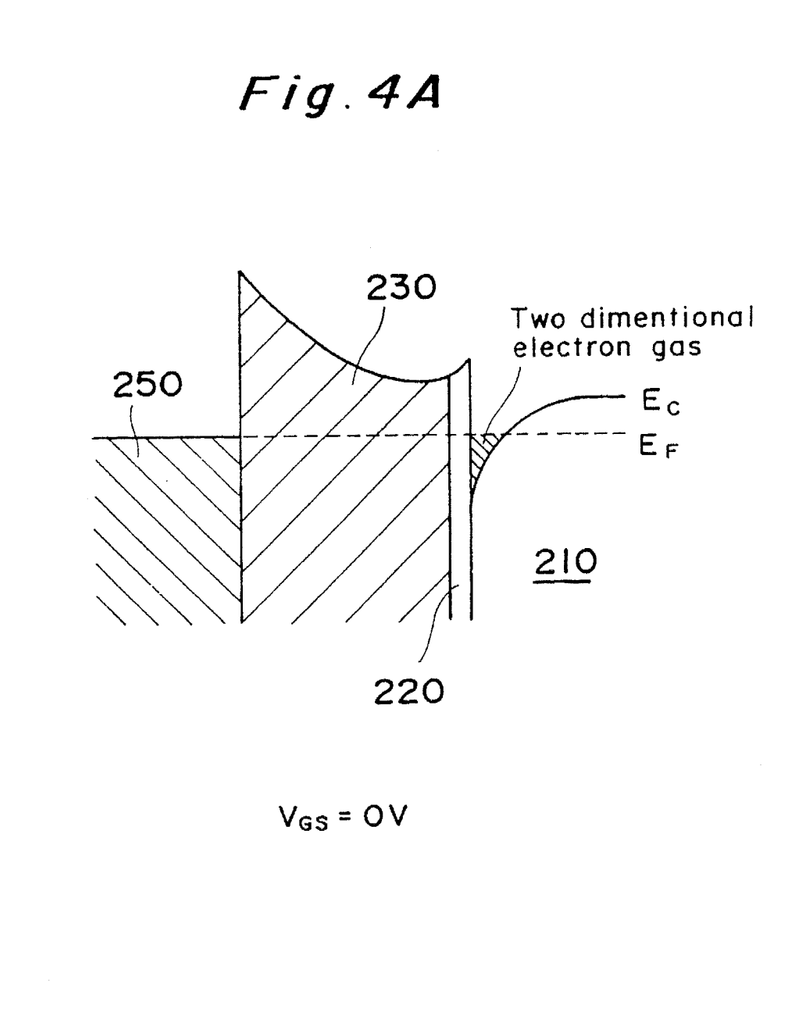
FIG. 4A shows an energy band when a gate voltage VGS=0.
Figure 4B:
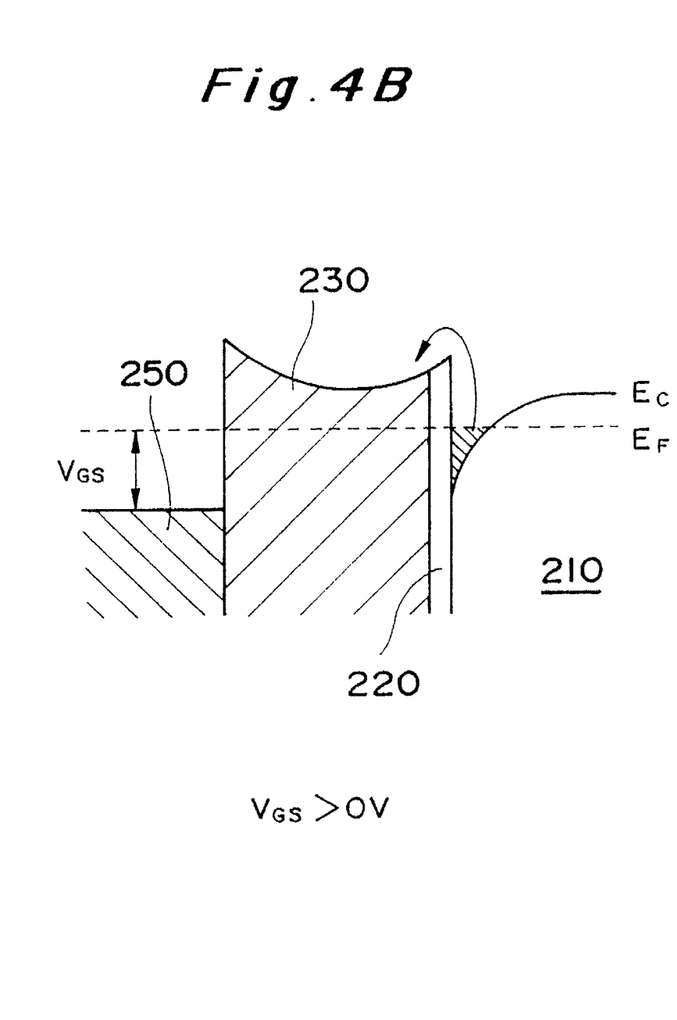
FIG. 4B shows an energy band when the gate voltage VGS>0 and a portion of two-dimensional electron gas transits to an n+AlGaAs layer 230.

FIG. 4 shows an energy band chart of the HEMT shown in FIG. 1 along a line X—X, in which Ec denotes a bottom of a conduction band and Ev denotes a Fermi level. As shown in FIG. 4A, as the gate voltage $V_{GS}$ is raised toward a positive side, a portion of the two-dimensional gas generated in the interface of the undoped GaAs layer 210 transits to the n$^+$AlGaAs layer 230 as shown in FIG. 4B. As result, a total electron mobility is reduced and the gm also is abruptly reduced from the peak.

The peak profile of the transfer conductance gm leads to a small design margin and a low yield for an integrated circuit (IC) when the integrated circuit is to be fabricated by using the HEMT. In the HEMT structure, since the abruptness in the interface of AlGaAs/GaAs is important, the planar gate electrode by the self-alignment ion implantation is not adopted. Because it is necessary to anneal the ion-implanted Si at a high temperature in order to activate it, and if Al in the AlGaAs layer is diffused into the GaAs layer in the annealing step, the electron mobility and a saturation velocity are significantly reduced. Accordingly, the gate electrode in the HEMT is usually of recessed type, and a variance of depth of the recess in an etching process to form the recess is reflected to a variance of Vth. From the aspect of the process margin, too, the prior art HEMT is not always suitable as a device for constructing an integrated circuit.

SUMMARY OF THE INVENTION

In the light of the above, it is an object of the present invention to provide a high speed transistor having features of both the pulse doped MESFET (a wide operation range) and the HEMT (a high gain).

It is another object of the present invention to provide a HEMT which has a high gm and exhibits a small change of gm relative to the gate bias like the pulse doped MESFET.

In order to achieve the above object, a semiconductor device (for example, a field effect transistor (FET)or a monolithic integrated circuit comprising the FET) of the present invention which has a drain electrode, a source electrode and a gate electrode, and controlling a current flowing through a channel (current path) between the drain and the source by a voltage applied to the gate electrode, comprises:

A compound semiconductor channel layer (a layer in which the channel is formed) formed by a GaAs layer including n-type dopant (for example, Si, SE, S or Te) and undoped GaInAs layers (compound semiconductor layers having no dopant added thereto., Impurity may be included) sandwiching the GaAs layer; and a compound semiconductor buffer layer made of an undoped semiconductor (for example, GaAs, GaInAs or AlGaAs ) having a larger electrical negative degree than that of GaInAs. The channel layer is formed between the buffer layer and the gate electrode. The semiconductor device may further comprise an undoped cap layer electrically connected to said gate electrode and made of a semiconductor having a larger band gap than that of GaInAs. The channel layer may include at least one layer including n-type dopant, undoped GaAs layers sandwiching said said n-type dopant layer and undoped GaInAs layers sandwiching said GaAs layer.

The channel layer may include an n-type GaAs layer doped with n-type dopant and undoped GaInAs layers sandwiching the GaAs layer.

A method for manufacturing a semiconductor device of the present invention comprises the steps of:

Sequentially forming a buffer layer made of undoped GaAs and an undoped GaInAs layer on a GaAs substrate;

alternately growing an undoped GaAs layer and a delta doped layer having n-type dopant delta-doped on the GaInAs layer to form a channel layer;

forming a GaInAs layer and an undoped GaAs layer on the channel layer and forming a gate electrode on a predetermined area on the undoped GaAs layer; and forming a source region and a drain region by ion implantation with self-alignment to the gate electrode and forming a source electrode and a drain electrode.

Another method for manufacturing a semicondutor device of the present invention comprises the steps of:

sequentially forming a buffer layer made of undoped GaAs and an undoped GaInAs layer on a GaAs substrate;

sequentialy growing an undoped GaAs layer, a delta doped layer having n-type dopant delta-doped, and an undoped GaAs layer on the GaInAs layer to form a channel layer;

forming a GaInAs layer and an undoped GaAs layer on said channel layer and forming a gate electrode on a pre-determined area on the undoped GaAs layer; and forming a source region and a drain region by ion implantation with self-alignment to the gate electrode and forming a source electrode and a drain electrode.

In the semiconductor device of the present invention, two dimensional electron gas is formed in the vicinity of the hetero-interface of the GaAs layer including at least one two-dimension layer which includes n-type dopant and the underlying GaInAs. Since the electrons of the two-dimensional electron gas have a very high saturation velocity, an operation speed is very high. The hetero-junction is formed by the GaInAs layer and a buffer layer made of a semiconductor having a higher electronegativity and a larger band gap than those of GaInAs, and an energy barrier of a conduction band is formed in the hetero-interface. As a it is more difficult for the electrons of the two-dimensional electron gas to flow into the buffer layer, and the rise of the transfer conductance gm at the gate bias near the threshold voltage Vth is abrupt.

Since the channel layer has a lamination structure of the two-dimensional layer including the n-type dopant and the undoped GaAs layer, even if a portion of the two-dimensional electrons makes a real space transition and jumps into the GaAs layer when a gate bias (a positive voltage bias) to increase the drain current is applied, the reduction of the electron mobility and the saturation velocity are suppressed compared to the prior art HEMT which uses the Si-doped AlGaAs layer. Further, since the electrons which made the real space transition to the GaAs layer fall into a quantum well of the GaInAs layer on the GaAs layer to form the two-dimensional gas, the abrupt reduction of the transfer conductance gm on the positive voltage side of the gate bias, which is inherent to the prior art HEMT, is avoided.

In accordance with the semiconductor device of the present invention, since the two-dimensional electron gas is formed in the vicinity of the hetero-interface, a very high speed operation is attained and the abrupt rise of the transfer conductance gm is attained by the energy barrier of the conduction band of the hetero-interface. Further, the abrupt reduction of the transfer conductance gm is prevented by the band structure of the hetero-interface of the GaAs layer and the GaInAs layer, and a high gain and a high operating speed are attained over a wide range of gate bias.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4A and 4B show an energy band chart of the HEMT, in which

FIGS. 8A and 8B show a band structure of a HEMT of the present invention, in which

DETAILED DESCRIPTION OF THE PREFERRED EMBODIMENTS

The preferred embodiments of the present invention are now explained with reference to the drawings. The like or identical elements to those of the prior art device described above are simplified or omitted in the explanation. Doping indicates the addition of impurity and undoping indicates non-addition of impurity.

Figure 5:
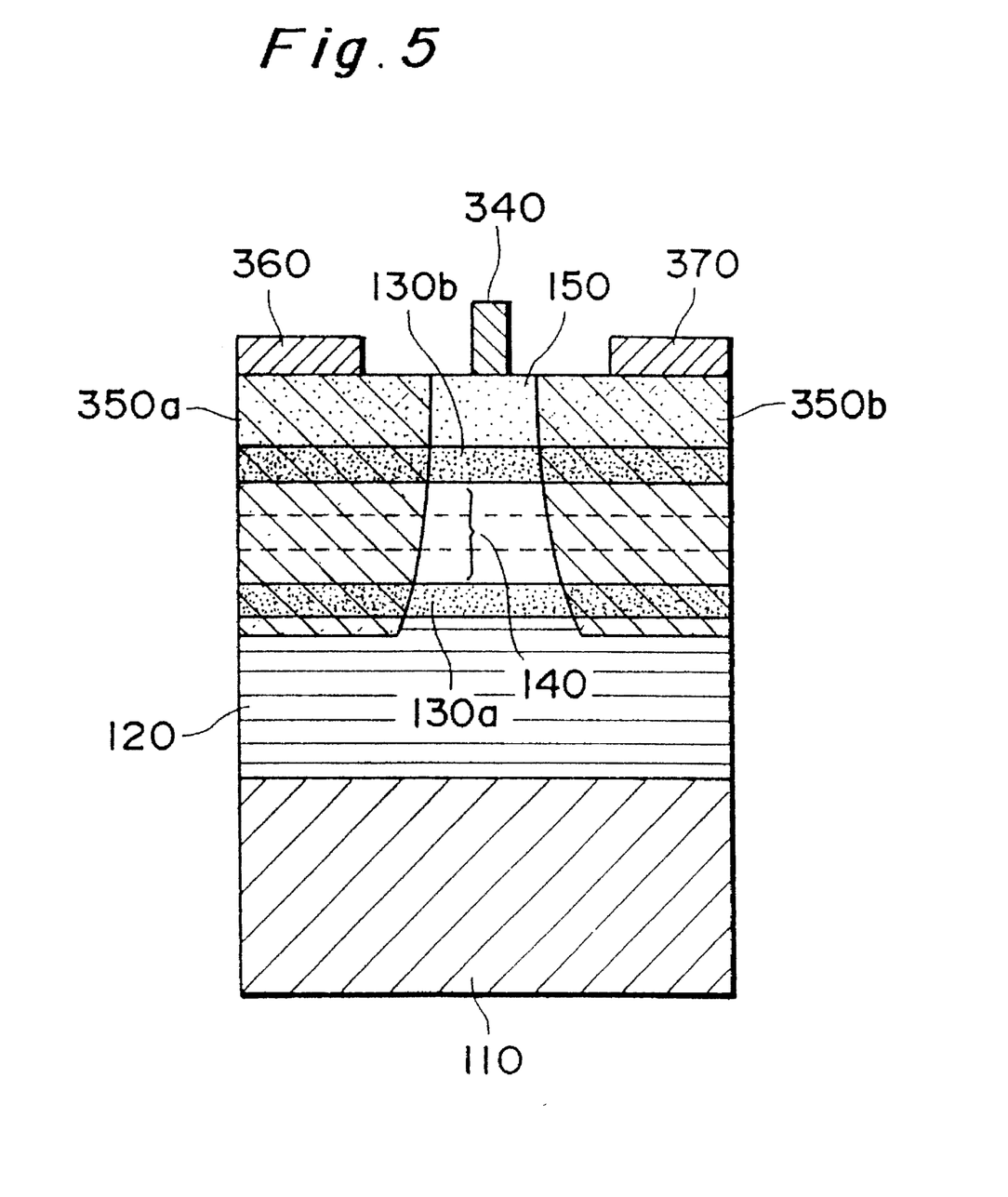
FIG. 5 shows a structure of a first embodiment of the present invention.

FIG. 5 shows a first embodiment in which the present invention is applied to a field effect transistor. The transistor is characterized by a three-layer structure channel layer in which undoped GaInAs compound semiconductor layers 130a and 130b are arranged above and beneath a GaAs compound semiconductor layer 140 having at least one delta doped layer (n type). The delta doped layer is a thin layer having impurities doped planarly and it has a substantially stepwise impurity distribution with respect to overlying and underlying layers.

A cap layer 150 which is an undoped GaAs compound semiconductor layer and a buffer layer 120 are formed above and beneath a channel layer of the three-layer structure (undoped GaAs layer layers 130a and 130b). They are formed above a substrate 110. Like the pulse doped MESFET, a gate electrode 340, n$^+$ion implantation layers (a source region and a drain region) 350a and 350b which are self-aligned to the gate electrode, a source electrode 360 and a drain electrode 370 are formed.

A transfer conductance gm characteristic of the present transistor is deemed as shown by a solid line in FIG. 3. The rise of the transfer conductance gm in the vicinity of the threshold level Vth is more abrupt than that of the pulse doped MESFET, and the transfer conductance gm can be suppressed even if the gate bias is driven into a positive side. Further, the transfer conductance gm is deemed to be generally higher than that of the pulse doped MESFET. Namely, it deems to have the combined characteristics of the wide operation range of the pulse doped MESFET, and the high gain of the HEMT. It is considered that those characteristic are due to the following.

The present transistor has the channel layer of the three-layer structure as the channel, and the two-dimensional electron gas is formed in the interface of the GaAs layer 140 and the GaInAs layer 130a, and in the interface of the GaAs layer 140 and the GaInAs layer 130b. The electrons of the two-dimensional electron gas have a higher saturation velocity than a velocity at which they move in the pulse doped GaAs layer. As a result, a response speed or an operation speed is high. The current flowing between the source electrode 360 and the drain electrode 370, that is, the movement of the electrons of the two-dimensional electron gas is controlled by controlling the band structure of the interface by applying a voltage to the gate electrode 340. In this manner, the same high speed as that of the HEMT is attained.

An energy barrier is formed in the conduction band in the hetero-interface of the GaInAs layer 130a and the buffer layer 120(GaAs) due to difference between the band structures. Since for the electrons, it is difficult to flow into the buffer layer 120 by the energy barrier, the rise of the transfer conductance gm is abrupt when the gate bias is near the threshold level Vth. This causes a difference in the characteristic from the pulse doped MESFET.

Even if a portion of the two-dimensional electrons of the GaInAs layer 130a makes the real space transition and jumps into the GaAs layer 140 at a gate bias point which causes the increase of the drain current, that is, at a gate bias point driven into a positive side, the reduction of the electron mobility and the saturation velocity is not as much as that of the Si-doped AlGaAs layer of the HEMT, because the GaAs layer 140 includes the GaAs layer having the impurity delta-doped. Further, the GaInAs layer 130b is formed over the GaAs layer 140, and the electrons flow into the GaInAs layer 130b having a low potential of the conduction band to form the two-dimensional electrons. In this manner, the abrupt reduction of the transfer conductance gm which is inherent to the prior art HEMT is prevented and a wide operation range for the gate bias is attained.

Further, since the gate electrode is of planar structure, the transistor is very much suitable for use in constructing an integrated circuit.

Figure 6A:
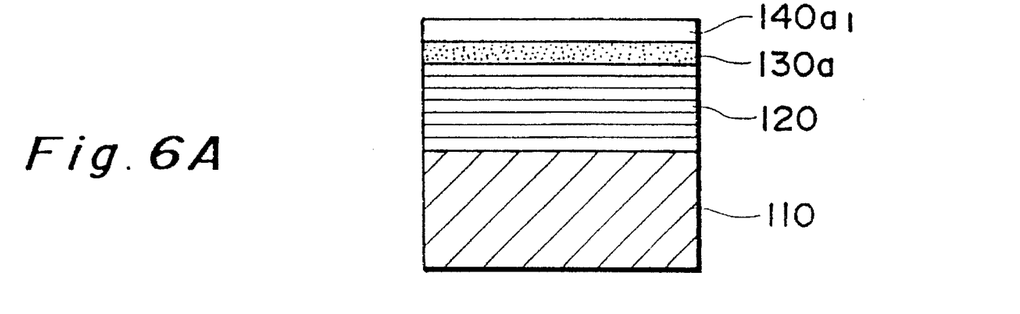
FIG. 6A–6C show a manufacturing process of the first embodiment.
Figure 6B:
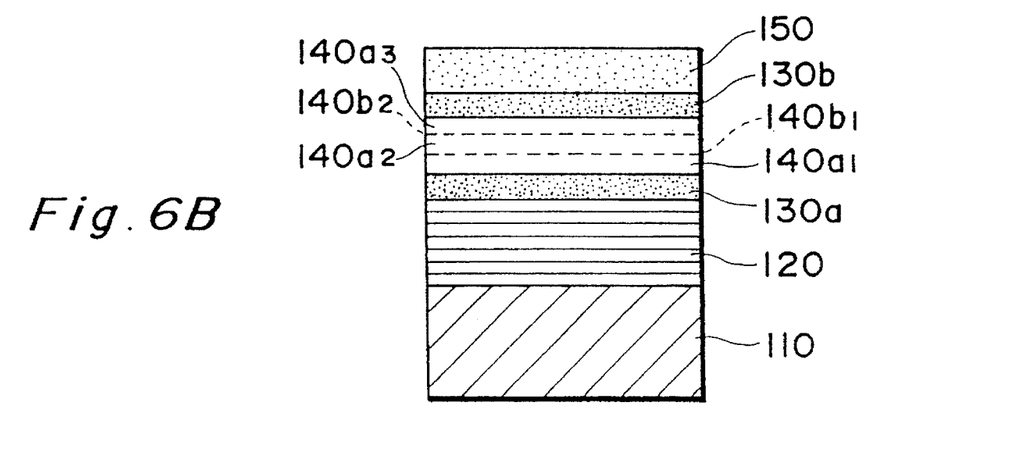
Figure 6C:
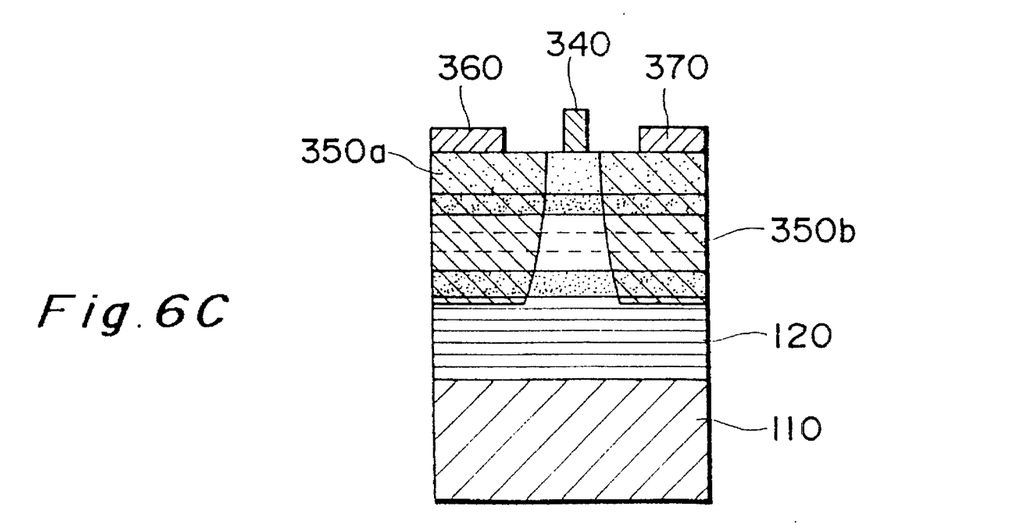

A manufacturing process of the transistor of FIG. 6A–6C is now explained.

The buffer layer 120 made of undoped GaAs having a p carrier conductivity type (a carrier density is substantially equal to an impurity concentration of ~5×10$^{15}$ cm$^{-3}$) is formed on the semi-insulating GaAs substrate 110 to a thickness of 10,000 angstrom by using an organic metal vapor phase growth method (OMVPE method) or a molecule beam epitaxy method (MBE method). Then, the GaInAs layer 130a made of undoped Ga$_{0.72}$In$_{0.18}$As having an n carrier conductivity type (a carrier density of ~5×10$^{15}$ cm$^{-3}$) is formed to a thickness of 80 angstrom on the buffer layer 120. Then, the undoped GaAs layer 140a having an n carrier conductivity type (a carrier density of ~1×10$^{15}$ cm$^{-3}$) is formed to a thickness of 25 angstrom (FIG. 6A).

The delta doped layer 140b1 having an n-type impurity such as Si or Se delta-doped is formed on the undoped GaAs layer 140a1. Then, the undoped GaAs layer 140a2 having an n carrier conductivity type (a carrier density of ~1×10$^{15}$ cm$^{-3}$) is formed to a thickness of 25 angstrom. A similar step is repeated to form the delta-doped layer 140b2 and the undoped GaAs layer 140a3. Then, the GaInAs layer 130b made of undoped Ga$_{0.80}$In$_{0.20}$As having an n carrier conductivity type (a carrier density of ~1×10$^{15}$ cm$^{-3}$) is formed to a thickness of 100 angstrom on the undoped GaAs layer 140a3. Then, the cap layer 150 made of undoped GaAs having an n carrier conductivity type (a carrier density of ~1×10$^{15}$ cm$^{-3}$) is formed to a thickness of 300 angstrom (FIG. 6B).

The gate electrode 340 is formed on the epi-structure of FIG. 6B. The n$^+$ion implantation layers (the source region and the drain region) 350a and 350b, the source electrode 360 and the drain electrode 370 are formed by self-alignment to the gate electrode 340 to complete the transistor (FIG. 6C).

In the present manufacturing process, since a compound semiconductor which includes Al is not used as a channel material even in the aneal process after the ion implantation, the reduction of the electron mobility and the saturation velocity is suppressed.

In this manner, the transistor which has the advantages of both the HEMT and the pulse doped MESFET in provided, and it is useful as a low noise device, a high frequency device or a high speed device. Since the epi-structure and the electrode structure are suitable for the integration, it may be useful as a transistor to construct an MMIC.

The first embodiment described above may be modified in various manners.

For example, parameters of the respective layers may assume various values and a variety of combinations may be used.

The buffer layer 120 does not directly contribute to the operation of the transistor but the thickness thereof is determined while taking the thickness of the layer to be formed thereon into consideration.

As to the carrier densities of the GaInAs layers 130a and 130b, the amount of background impurity varies with the growth equipment. Usually, it is smaller than $10^{16}$ cm$^{-3}$. The band gap varies with the proportion of In in GaInAs, and the electron velocity is higher as the amount of In increases. However, since the proportion of In is limited by the difference between lattice constants of GaInAs and GaAs, it is usually 0.1~0.3 (That is, Ga is 0.9~0.7). The thickness of the GaInAs layer may be up to a critical thickness which reduces as the proportion of In increases. In the present embodiment, it is up to 200 angstroms and thickness of the GaInAs layer may be 50–200 angstroms.

The carrier density of the GaAs layer 140 also varies with the growth equipment and it is usually smaller than $10^{16}$ cm$^{-3}$. A larger thickness of this layer is preferable but the larger the thickness is, the smaller is the mutual conductance. In balance with the layer to be formed thereon, an appropriate range may be 25–200 angstrom.

The carrier density of the cap layer 150 is also smaller than $10^{15}$ cm$^{-3}$. The thickness is 300 angstroms which is sufficient to confine the electrons. It may be determined to attain a desired mutual conductance gm.

The cap layer and the buffer layer may be single layers of compound semiconductor having a smaller electronegativity than that of GaAs, such as AlGaAs or GaInP or laminated structures of a combination of the compound semiconductor and GaAs, instead of the single layer structure of the undoped GaAs layer.

A plurality of delta-doped layers may be formed in the channel layer so that a transistor having a desired threshold level Vth is produced.

The gate electrode structure is of planar structure by the self-alignment ion implantation in the above embodiment although it may be of recessed structure (FIG. 1) having a contact layer of compound semicondutor (such as Si-doped GaAs layer or Si-doped GaInAs layer).

The GaInAs layer of the channel layer may be of structure having continuously or stepwise changing in proportion in the GaInAs layer. In this manner, the lattice mis-alignment of the crystal lattice of GaAs and GaInAs is relieved and the electron mobility is improved.

As to the chemical composition, GaInAs may be a material represented by a general formula $Ga_{1-x}In_xAs$ (x>0), AlGaAs may be a material represented by a general formula $Al_mGa_{1-m}As$ (m>0), and GaInP may be a material represented by a general formula $Ga_rIn_{1-r}P$ r≧0).

A second embodiment is now explained.

Figure 7:
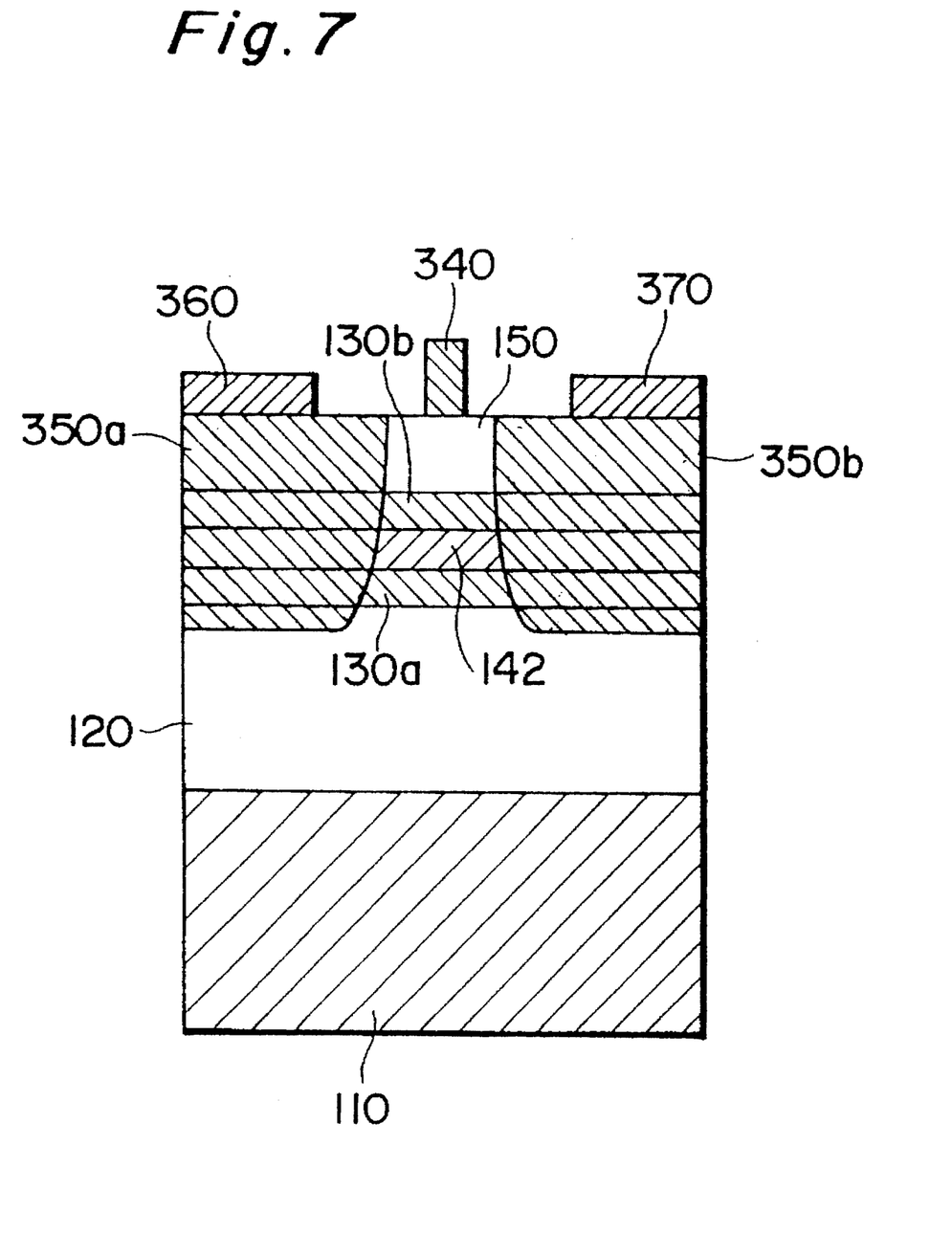
FIG. 7 shows a structure of a second embodiment of the present invention.

As shown in FIG. 7 in the structure of the present transistor, the undoped $In_xGa_{1-x}$ layer 130a (0<x≦1), the n-type GaAs layer 142 having impurity doped, the undoped $In_y Ga_{1-y}As$ layer 130b (0<y≦1) and the cap layer 150 are sequentially laminated on the buffer layer 120, and the gate electrode 340, the source electrode 360 and the drain electrode 370 are formed on the cap layer 150.

In the structure of the present transistor, an undoped GaAs spacer layer may be added in the interface of the undoped $In_xGa_{1-x}As$ (0<x≦1) layer 130a and the n-type GaAs layer 142 or in the interface of the undoped $In_yGa_{1-y}As$ (0<y≦1) layer 130b and the n-type GaAs layer 142. This will be described hereinlater.

Figure 8A:
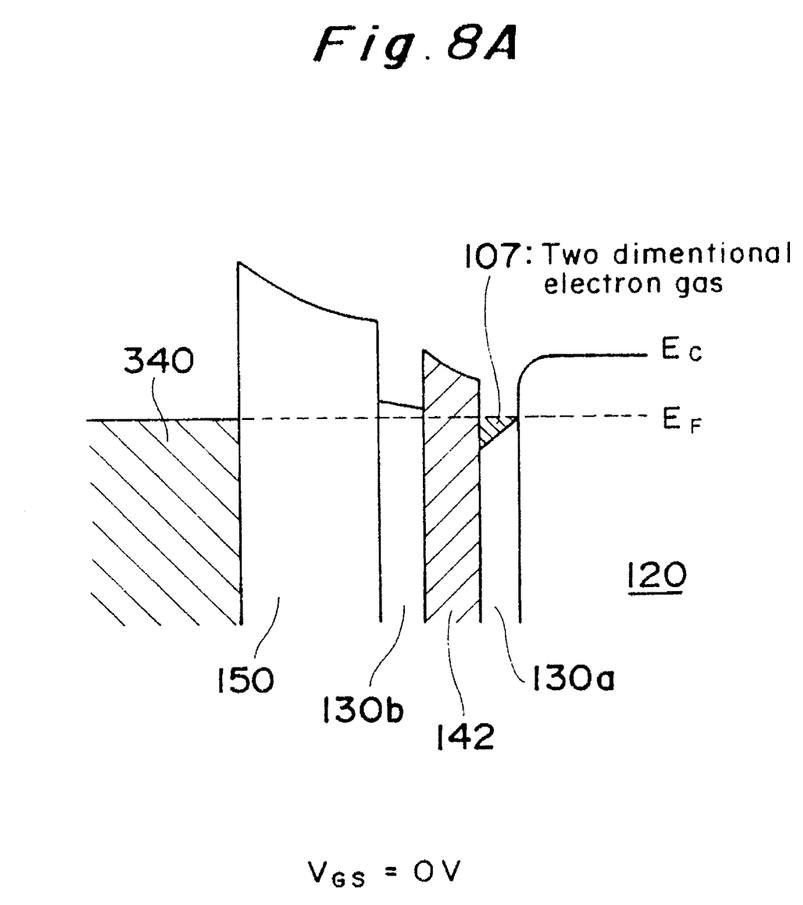
FIG. 8A shows a band structure when the gate voltage VGS=0 and FIG. 8B shows a band structure when the gate voltage VGS>0.
Figure 8B:
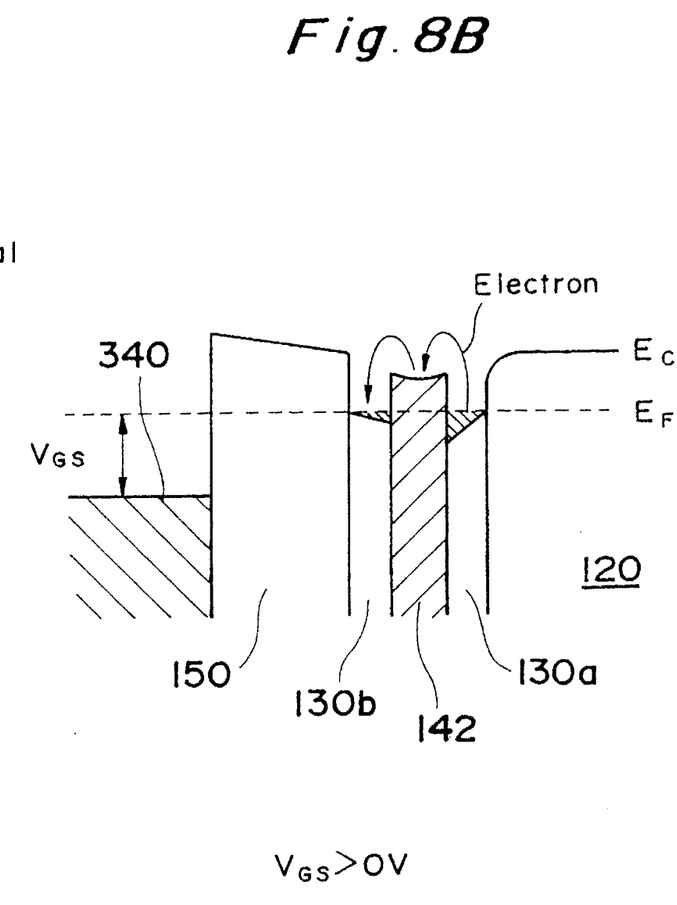

FIGS. 8A and 8B show a band diagram of the present transistor. FIG. 8A shows the band diagram when VGS=0 volt.

With the structure of the present transistor, when the gate bias is driven into the positive side (VGS>0) to increase the drain current, a portion of the two-dimensional electrons 107 generated in the interface with the undoped $In_xGa_{1-x}As$ layer 130a fall into the $In_yGa_{1-y}As$ layer 130b formed above the impurity doped GaAs layer 142 even if it makes the real space transition and jumps into the impurity doped GaAs layer 142. Accordingly, the reduction of gm which is inherent to the prior art HEMT can be prevented.

Figure 9A:
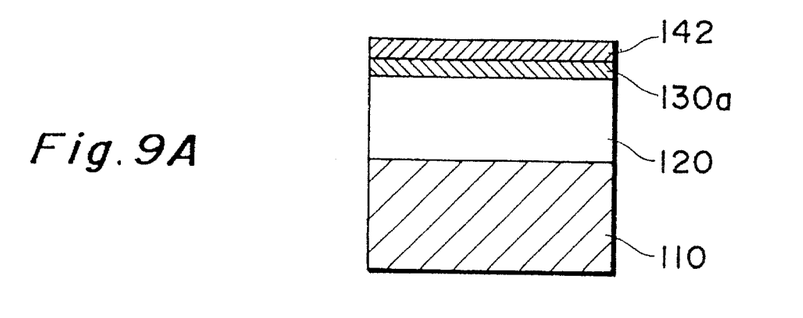
FIG. 9A–9C show a manufacturing process of a planar HEMT of an embodiment.
Figure 9B:
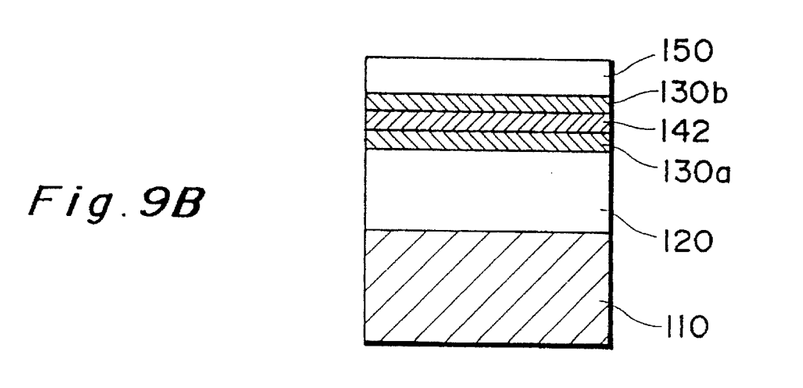
Figure 9C:
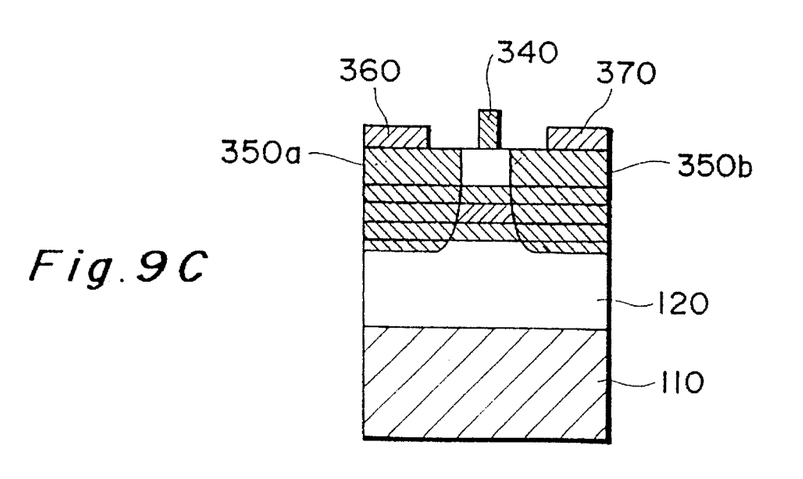

A manufacturing process of the present transistor is explained with reference to FIGS. 9A–9C.

The undoped GaAs buffer layer 120 having a p carrier conductivity type (~5×10$^{15}$ cm$^{-3}$) is formed to a thickness of 10,000 angstrom on the semi-insulative GaAs substrate 110 by the organaic metal vapor phase growth method (OMVPE method) or the molecule beam epitaxial method (MBE method). Then, the undoped $In_{0.18}Ga_{0.72}As$ layer 130a having an n carrier conductivity type (~1×10$^{15}$ cm$^{-3}$) is formed on the GaAs layer 120, and then the Si-doped GaAs layer 142 (4×10$^{18}$ cm$^{-3}$) is formed to a thickness of 100 angstrom (FIG. 9A). The undoped $In_{0.20}Ga_{0.80}As$ layer 130b having an n carrier conductivity type (~1×10$^{15}$ cm$^{-3}$) is formed on the Si-doped GaAs layer 142 to a thickness of 100 angstroms. Then, the undoped GaAs cap layer 150 having the n carrier conductivity type (~1×10$^{15}$ cm$^{-3}$) is formed to a thickness of 300 angstroms (FIG. 9B). The gate electrode 340 is formed on the laminated epitaxial structure, the n+ion implantation layers 350a and 350b are formed with the self-alignment to the gate electrode, it is annealed for a short period, and the source electrode 360 and the drain electrode 370 are formed on the n$^+$ ion implantation layers 350a and 350b. In this manner, the transistor with the planar structure is completed (FIG. 9C).

In the present embodiment, the parameters of the respective layers may assume various values as they do in the first embodiment and a variety of combinations may be used.

In this present manufacturing process, the lattice misalignment between the Si-doped GaAs layer 142 and the InGaAs layers 130a and 130b raises a problem, but it is reported that the lattice misalignment may be neglected if the thickness of the layer is sufficiently thin (J. J. Rosenberg et al, IEEE Electron Device Letters, pp 491–493, Vol. EDL-6, No. 10, October 1985).

Since the two-dimensional electron gas is formed in the interface of GaAs/InGaAs by inserting the $In_{0.18}Ga_{0.72}As$ layer 130a under the Si-doped GaAs layer 142, the electrons move faster than they move in the Si-doped GaAs layer 142 and have a higher saturation velocity. Since the energy barrier of the conduction band is formed in the hetero-interface of the $In_{0.18}Ga_{0.72}As$ layer 130a and the buffer layer 120, for the electrons it is harder to flow into the buffer layer 120 and the rise of gm is abrupt even at the gate bias which is in the vicinity of Vth.

When the gate bias is driven into the positive side to increase the drain current, the electrons fall into the $In_{0.20}Ga_{0.80}As$ layer 130b by the insertion of the $In_{0.20}Ga_{0.80}As$ layer 130b above the Si-doped GaAs layer even if a portion of the two-dimensional electrons makes the real space transition and jumps into the Si-doped GaAs layer 142. Accordingly, the abrupt reduction of gm which is inherent to the prior art HEMT can be prevented.

The band structure of FIG. 8 is equally applicable to the first embodiment described above.

Figure 10:
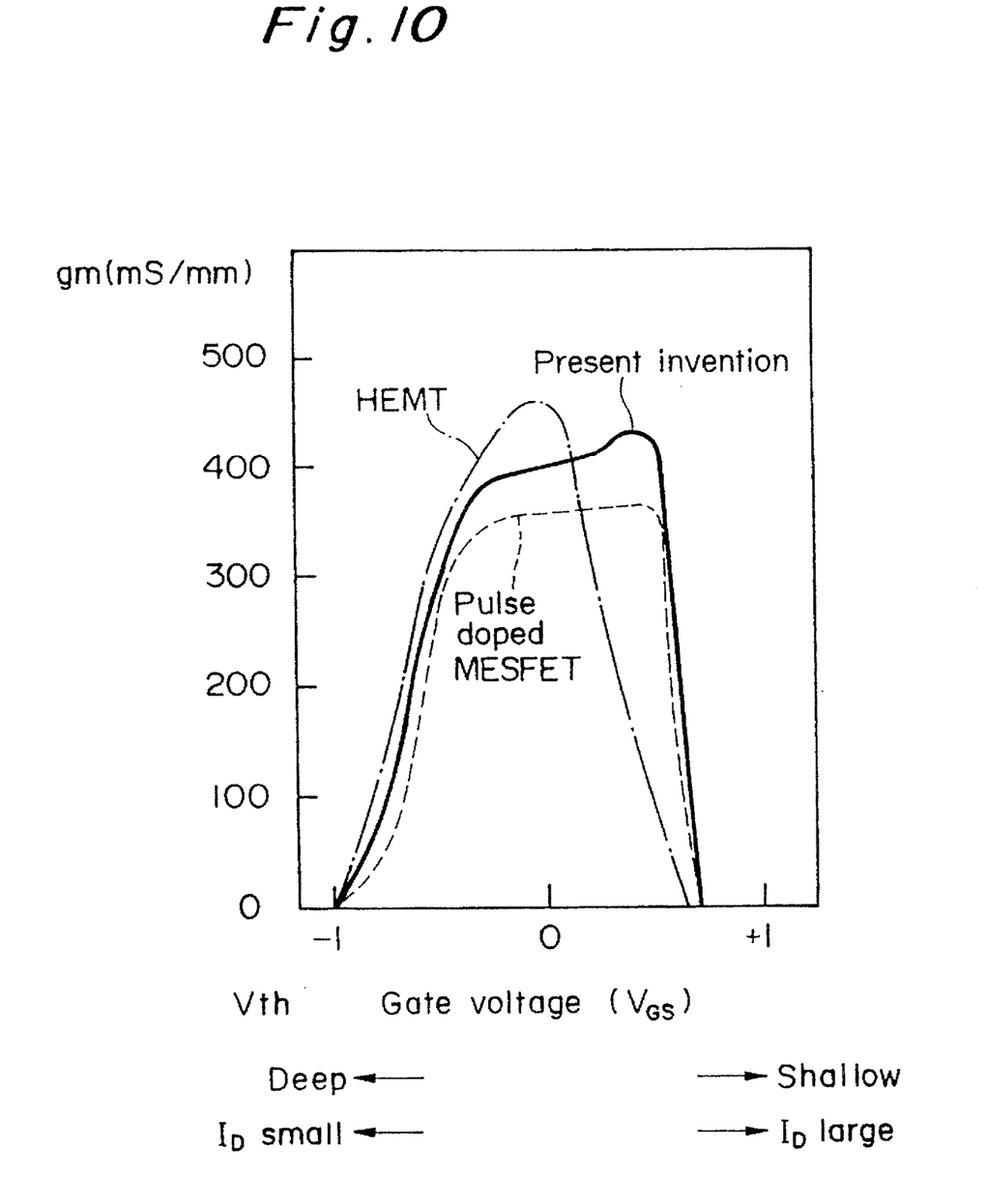
FIG. 10 shows a graph showing the dependency of gm to a gate bias in an AlGaAs/GaAs HEMT, a pulse doped MESFET and a HEMT of the present invention.

The dependency of gm on the gate electrode in the transistor having such a structure is shown by a solid line in FIG. 10. The rise of gm in the vicinity of Vth is more abrupt than that of the impurity doped MESFET, and gm has no peak profile as it does in the HEMT. Even if the gate bias is driven into the positive side, the gentle reduction of gm can be surppessed and gm is generally higher than that of the impurity doped MESFET.

The high electron mobility transistor of the present invention which exhibits the characteristic described above show an excellent characteristic.

The gate electrode informed on the undoped GaAs cap layer 150 and the source electrode 360 and the drain electrode 370 are formed in the ion implantation regions which are self-aligned to the gate electrode 340. Because of the planar structure, the present transistor is most suitable for use as a transistor for an integrated circuit. In the prior art HEMT it is not possible to adopt the planar structure by the self-alignment ion implantation because abruptness is required in the interface of AlGaAs/GaAs, and because in ion implantaton, high temperature annealing is required to activate the implanted Si and Al in the AlGaAs layer diffuses into the GaAs layer during the anneal process so that the electrons are subject to impurity scatter and the electron mobility and the saturation velocity are significantly reduced. In the present embodiment, the GaAs/InGaAs HEMT which includes a small diffusion atom In in the anneal process is used so that the planar structure is readily attaianed.

A third embodiment is now explained.

Figure 11A:
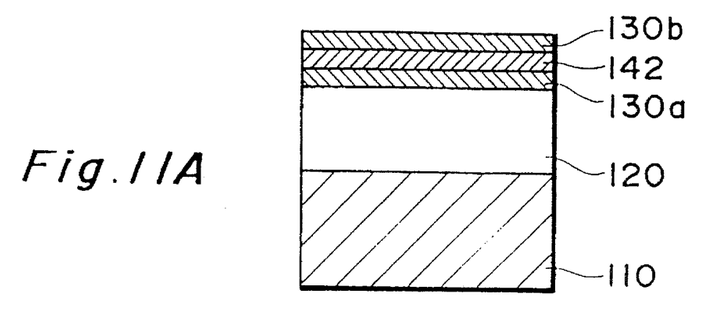
FIGS. 11A–11C show a manufacturing process of a planar HEMT of a third embodiment.
Figure 11B:
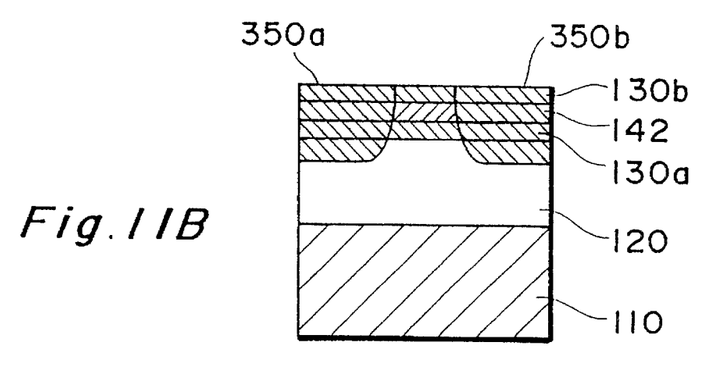
Figure 11C:
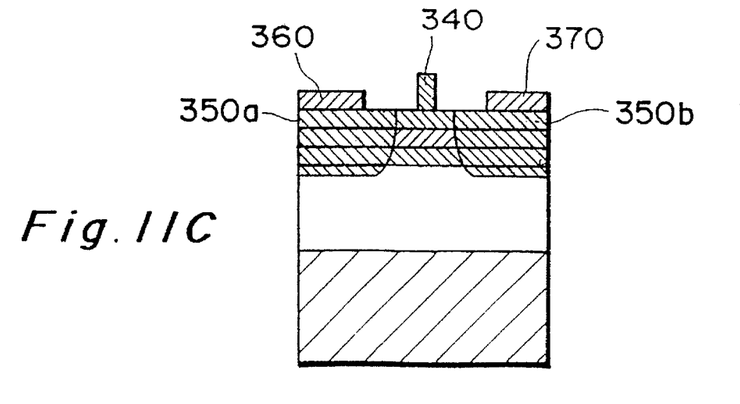

FIGS. 11A–11C show a manufacturing process thereof. The present embodiment differs from the previous embodiment in that the cap layer 150 is omitted and the electrodes 340, 360 and 370 are formed directly on the undoped $In_{0.20}Ga_{0.80}$ layer 130b (FIG. 11C). With such a structure, a gate leakage current slightly increases but the substantially same effect as that of the previous embodiment is attained.

In the above embodiments, the cap layer 150 and the buffer layer 120 are of single layer structure of undoped GaAs although they may be of single layer structure of a compound semiconductor such as AlGaAs or InGaP or of lamination structure of a combination of the compound semiconductor and GaAs.

The gate electrode structure is the planar structure using the self-alignment ion implantation in the above embodiment. Alternatively, as shown in FIG. 11A or FIG. 9B the source electrode 360 and the drain electrode 370 may be formed through the ohmic contact layer (Si-doped GaAs layer or Si-doped InGaAs layer) formed on the undoped $In_yGa_{1-y}As$ layer 130b or the cap layer 150 and the gate electrode may be formed on the undoped $In_yGa_{1-y}As$ layer 130b exposed at the bottom of the etched ohmic contact layer or the cap layer 150 to form a recessed structure.

The proportion of In in the InGaAs layers 130a and 130b above and beneath the pulse doped GaAs layer 142 may be continuously or stepwise changed in the InGaAs layer vertically to the plane to reline the lattice misalignment of the crystal lattices of the GaAs layer and the InGaAs layer to improve the electron mobility.

Further, the undoped GaAs spacer layer (which corresponds to the undoped AlGaAs spacer layer 220 in FIG. 1) may be inserted in the interface of GaAs/InGaAs.

With the structure having the spacer layer, the two-dimensional electron mobility can be enhanced by spacing the undoped GaAs spacer layer.

In accordance with the present invention, a transistor which has the advantages of both the HEMT and the impurity doped MESFET is provided and it is useful as a low noise device, a high frequency device or a high speed device. Since it has the epitaxial structure and the electrode structure which are suitable for the integration, it is useful as a transistor to construct a microwave monolithic integrated circuit (MMIC).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor in which a current flowing between a drain region and a source region is controlled by a voltage applied to a gate electrode, comprising:

a channel region having a multi-layer structure, said multi-layer structure including:

a lower semiconductor layer including a first compound semiconductor, an electron supply semiconductor layer including a second compound semiconductor and located on said lower semiconductor layer, and an upper semiconductor layer including said first compound semiconductor and located on said electron supply semiconductor layer, said electron supply semiconductor layer being sandwiched between said lower and upper semiconductor layers, whereby, when a predetermined threshold voltage is supplied to said gate electrode, a first channel is formed at an interface between said electron supply semiconductor layer and said lower semiconductor layer, and a second channel is formed by electrons falling into a quantum well at an interface between said electron supply semiconductor layer and said upper semiconductor layer, said electrons falling into said well including a first electron which has made a real space transition from said first channel and a second electron which has been supplied from said electron supply semiconductor layer.

2. A field effect transistor according to claim 1, further comprising:

a cap semiconductor layer contacting said upper semiconductor layer in said channel region and forming a potential barrier in an interface with said upper semiconductor layer; and a buffer semiconductor layer contacting said lower semiconductor layer in said channel region and forming a potential barrier in an interface with said lower semiconductor layer.

3. A field effect transistor according to claim 1, wherein said first compound semiconductor is an undoped compound semiconductor.

4. A field effect transistor according to claim 1, wherein said electron supply semiconductor layer in said channel region has a multi-layer structure, said multi-layer structure of said electron supply layer including:

a lower layer including said second compound semiconductor which is an undoped compound semiconductor;

a delta-doped layer being formed on said lower layer and including said second compound semiconductor which is doped with n-type impurity; and an upper layer being formed on said delta-doped layer, and including said second compound semiconductor which is an undoped compound semiconductor.

5. A field effect transistor according to claim 1, wherein said electron supply semiconductor layer in said channel region includes said second compound semiconductor doped with an n-type impurity.

6. A field effect transistor according to claim 1, further comprising a spacer semiconductor layer formed between said lower semiconductor layer and said electron supply layer, said spacer semiconductor layer including said second compound semiconductor which is an undoped compound semiconductor, said spacer semiconductor layer being in contact with said lower semiconductor layer and being in contact with said electron supply layer.

7. A field effect transistor according to claim 1, wherein a compound proportion in each of said lower and upper semiconductor layers changes continuously in a direction vertical to both surfaces of said electron supply semiconductor layer.

8. A field effect transistor according to claim 1, wherein a compound proportion in each of said lower and upper semiconductor layers changes stepwise in a direction vertical to both surfaces of said electron supply semiconductor layer.

9. A field effect transistor in which a current flowing between a drain region and a source region is controlled by a voltage applied to a gate electrode, comprising:

a channel region having a multi-layer structure, said multi-layer structure including
a lower undoped GaInAs layer,
a GaAs layer including an n-type impurity and being formed on said lower undoped GaInAs layer, and an upper undoped GaInAs layer being formed on said GaAs layer, said GaAs layer being sandwiched between said lower and upper undoped GaInAs layers.

10. A field effect transistor according to claim 9, further comprising:

a cap semiconductor layer contacting said upper undoped GaInAs layer in said channel region and forming a potential barrier in an interface with said upper undoped GaInAs layer; and a buffer semiconductor layer contacting said lower undoped GaInAs layer in said channel region and forming a potential barrier in an interface with said lower undoped GaInAs layer.

11. A field effect transistor according to claim 9, wherein said GaAs layer in said channel region has a multi-layer structure, said multi-layer structure of said GaAs layer including:

a lower layer including undoped GaAs;
a delta-doped layer being formed on said lower layer, and including GaAs doped with an n-type impurity; and
an upper layer being formed on said delta-doped layer, and including undoped GaAs.

12. A field effect transistor according to claim 11, wherein carrier densities of said lower layer and upper layer are smaller than $10^{15}$ cm$^{-3}$.

13. A field effect transistor according to claim 10, wherein said cap semiconductor layer has a carrier density of $10^{15}$ cm$^{-3}$ or less, and a thickness of 300 angstroms.

14. A field effect transistor according to claim 10, wherein said buffer semiconductor layer primarily includes $Ga_{0.72}In_{0.18}As$ and has a carrier density of $10^{15}$ cm$^{-3}$ or less, and a thickness of 10000 angstroms.

15. A field effect transistor according to claim 9, wherein said upper undoped GaInAs layer primarily includes $Ga_{0.80}In_{0.20}As$ and has a carrier density of $10^{15}$ cm$^{-3}$ or less, and a thickness of 100 angstroms.

16. A field effect transistor according to claim 9, wherein said GaAs layer in said channel region includes GaAs doped with an n-type impurity.

17. A field effect transistor according to claim 9, further comprises a spacer semiconductor layer formed between said lower undoped GaInAs layer and said GaAs layer, said spacer semiconductor layer being in contact with said lower undoped GaInAs layer and in contact with said GaAs layer.

18. A field effect transistor according to claim 9, wherein said GaAs layer has carrier density of $10^{18}$ cm$^{-3}$.

19. A field effect transistor according to claim 9, wherein a compound proportion in each of said lower and upper undoped GaInAs layers changes continuously in a direction vertical to both surfaces of said GaAs layer.

20. A field effect transistor according to claim 9, wherein a compound proportion in each of said lower and upper undoped GaInAs layers changes stepwise in a direction vertical to both surfaces of said GaAs layer.

* * * * *